United States Patent
Kim et al.

(10) Patent No.: US 12,444,624 B1
(45) Date of Patent: Oct. 14, 2025

(54) BLADE DICING DEVICE FOR WAFERS

(71) Applicant: SP Semiconductor & Communication Co., Ltd., Bucheon-si (KR)

(72) Inventors: Jae Up Kim, Bucheon-si (KR); Ki Joon Ahn, Bucheon-si (KR); Jeong Min Kim, Bucheon-si (KR); Sung Rae Jin, Bucheon-si (KR)

(73) Assignee: SP SEMICONDUCTOR & COMMUNICATION CO., LTD., Bucheon-si (KR)

( * ) Notice: Subject to any disclaimer, the term of this patent is extended or adjusted under 35 U.S.C. 154(b) by 0 days.

(21) Appl. No.: 19/213,940

(22) Filed: May 20, 2025

(30) Foreign Application Priority Data

Oct. 14, 2024 (KR) .................. 10-2024-0139233

(51) Int. Cl.
| | |
|---|---|
| H01L 21/67 | (2006.01) |
| B24B 41/053 | (2006.01) |
| B24D 5/16 | (2006.01) |
| B24D 7/16 | (2006.01) |
| B26D 1/00 | (2006.01) |
| B26D 3/06 | (2006.01) |

(52) U.S. Cl.
CPC ........ *H01L 21/67092* (2013.01); *B24D 5/165* (2013.01); *B24D 7/16* (2013.01); *B26D 1/0006* (2013.01); *B26D 3/06* (2013.01); *B24B 41/053* (2013.01); *B26D 2001/002* (2013.01)

(58) Field of Classification Search
CPC ........ B24D 5/16; B24D 5/165; B24D 27/165; B24D 5/02; B24D 7/16; B24B 45/00–006; B24B 23/022; B24B 41/053; B28D 1/24; B28D 5/0005; B28D 5/023
USPC ............... 451/342, 548, 514, 515, 518, 508; 125/15, 20
See application file for complete search history.

(56) References Cited

U.S. PATENT DOCUMENTS

| | | | |
|---|---|---|---|
| 2,089,168 A * | 8/1937 | Brown ................. | F16D 1/0882 403/259 |
| 2,886,358 A * | 5/1959 | Munchbach ........... | F16D 1/116 403/359.5 |
| 4,188,161 A | 2/1980 | Cuilleron | |
| 9,636,844 B2 * | 5/2017 | Wakita ...................... | B27B 5/30 |
| 11,192,190 B2 * | 12/2021 | Su .......................... | B23B 31/18 |
| 2008/0092714 A1 | 4/2008 | Miranda et al. | |

FOREIGN PATENT DOCUMENTS

| | | |
|---|---|---|
| KR | 20010003739 A | 1/2001 |
| KR | 20150014458 A | 2/2015 |
| KR | 20180095458 A | 8/2018 |
| KR | 20230024209 A | 2/2023 |

* cited by examiner

*Primary Examiner* — Robert F Neibaur
(74) *Attorney, Agent, or Firm* — CANTOR COLBURN LLP

(57) ABSTRACT

Provided is a blade dicing device for wafers that cuts (dices) a wafer with the grit on a cutting blade and separates the wafer into individual chips, and that can minimize process defects when dicing compound semiconductor wafers made of high-hardness materials such as SiC. The device includes a body, a cutting blade protruding from the outer periphery of the body, and grit bonded and attached to the outer periphery of the cutting blade and cutting a wafer, wherein the length of the grit is 2 μm to 4 μm.

4 Claims, 3 Drawing Sheets

BLADE DICING DEVICE FOR WAFERS

BACKGROUND

Technical Field

The present disclosure relates to a blade dicing device for wafers that cuts (dices) a wafer with the grit on a cutting blade and separates the wafer into individual chips and, more particularly, to a blade dicing device for wafers that can minimize process defects when dicing compound semiconductor wafers made of high-hardness materials such as SiC.

Description of the Related Art

Silicon (Si)-based devices that utilize silicon as their primary component are commonly used in power semiconductor packages, and after the devices are fabricated on a wafer, a dicing process is used to separate individual chips or dies from the wafer.

Dicing methods include blade dicing, laser dicing, stealth dicing, and plasma dicing, and blade dicing, with its speed, cost-effectiveness, and precision, is a common choice.

A typical blade dicing device includes a body made of aluminum and a cutting blade that protrudes from the outer periphery of the body and cuts (dices) through a wafer. The cutting blade features a diamond-coated periphery with grit bonded thereto for cutting the wafer, and a pocket groove is formed between grit particles to reduce frictional heat caused by dicing.

Recently, the demand for compound semiconductor devices such as silicon carbide (SiC) and silicon carbide (GaN) devices is rising as they offer advantages in high temperature/high-speed operation, efficient heat dissipation, and fast switching speeds, leading to increased efficiency and reliability.

Since both silicon carbide and silicon carbide are significantly harder than silicon, using a standard blade dicing device on them would likely result in blade breakage and incomplete cuts due to excessive wear. For reference, the Mohs hardness of a Si wafer is approximately 6.5, while the Mohs hardness of a SiC wafer is around 9.5, and that of a GaN wafer is about 8.5. When a dicing blade breaks, the broken fragments can physically damage the upper part of the devices on the wafer. Moreover, during dicing processing, the blade fails to reach the bottom of the wafer due to wear, causing an incomplete cut.

Therefore, a blade dicing device for wafers is required to more efficiently cut wafers when producing high-hardness compound semiconductor devices without defects.

For reference, examples of related art regarding a blade dicing device for wafers include Korean Patent Application Publication No. 10-2023-0024209 entitled "METHOD FOR SHAPING CUTTING BLADE" and Korean Patent Application Publication No. 10-2018-0095458 entitled "CUTTING BLADE AND CUTTING DEVICE".

SUMMARY

Accordingly, the present disclosure has been made keeping in mind the above problems occurring in the related art, and the present disclosure is intended to provide a blade dicing device for wafers capable of cutting wafers for producing high-hardness compound semiconductor devices, the demand of which is increasing, without defects and preventing blade breakage.

In order to achieve the above objective, according to an aspect of the present disclosure, there is provided a blade dicing device for wafers including: a body; a cutting blade protruding from the outer periphery of the body; and grit bonded and attached to the outer periphery of the cutting blade and configured to cut a wafer.

The length of the grit may be 2 μm to 4 μm.

The thickness of the cutting blade may be 35 μm to 40 μm, and the length of the cutting blade protruding from the outer periphery of the body may be 650 μm to 750 μm.

The rotation speed of the cutting blade may be 35,000 RPM to 45,000 RPM.

The speed at which a wafer is fed to the cutting blade may be 1.3 mm/s to 3.0 mm/s.

A blade dicing device for wafers of the present disclosure is a product that can dice wafers of high-hardness compound semiconductor devices made from SiC and GaN without damage to the cutting blade and without causing wafer defects during the dicing process, and is an invention very useful for industrial development.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
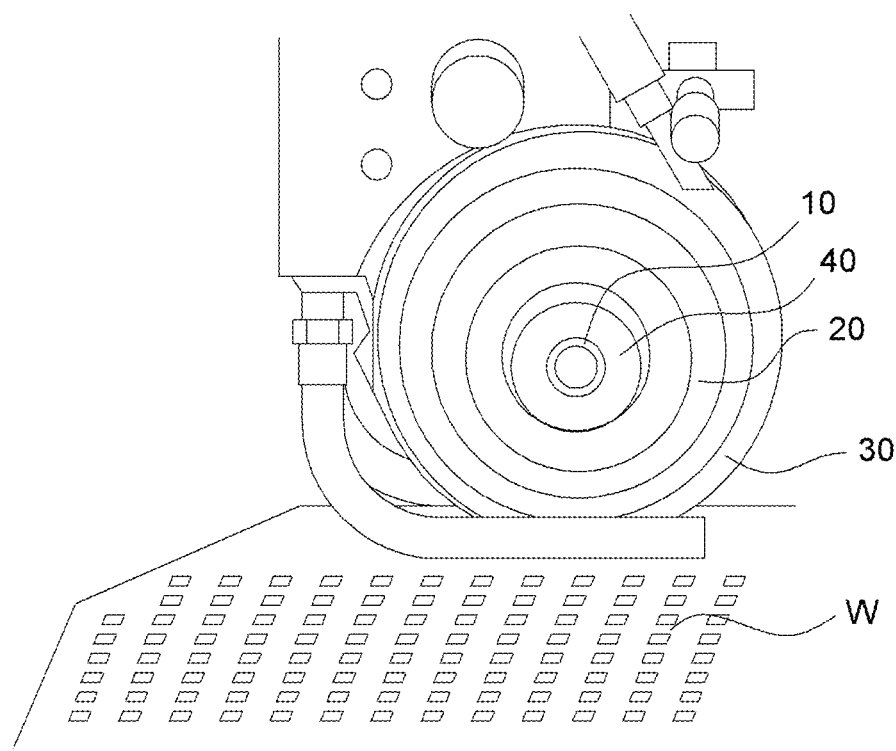
FIG. 1 is a perspective view of a blade dicing device for wafers according to an embodiment of the present disclosure.

Hereinafter, a blade dicing device for wafers according to the present disclosure will be described in more detail with reference to the drawings.

Before describing the blade dicing device for wafers according to the present disclosure in more detail, it should be noted that the present disclosure may have various modifications and various forms, and thus aspects (or embodiments) thereof will be described in detail in the text. However, this is not intended to limit the present disclosure to a specific disclosure form, but should be understood to include all modifications, equivalents, or substitutes included in the spirit and technical scope of the present disclosure.

In each drawing, the same reference numerals, especially the same tens and ones digits, or the same tens and ones digits, and alphabets, indicate members having the same or similar functions, and unless otherwise specified, the member indicated by each reference numeral in the drawing is assumed to be a member that complies with these standards.

In addition, in each drawing, although the components are expressed in an exaggerated or simplified manner in size or thickness for convenience of understanding, etc., the scope of protection of the present disclosure should not be interpreted as being limited by this.

The terms used in this specification are used only to describe particular implementation aspects (or embodiments) and are not intended to limit the present disclosure. Singular expressions include plural expressions unless the context clearly indicates otherwise. In this application, it should be understood that terms such as "comprises" or "consists of" are intended to specify the presence of a feature, number, step, operation, component, part, or combination thereof described in the specification, but do not exclude in advance the possibility of the presence or addition of one or more other features, numbers, steps, operations, components, parts, or combinations thereof.

Unless otherwise defined, all terms used herein, including technical or scientific terms, have the same meaning as commonly understood by one of ordinary skill in the art to which the present disclosure belongs. Terms defined in commonly used dictionaries should be interpreted as having a meaning consistent with their meaning in the context of the relevant art, and will not be interpreted in an idealized or overly formal sense unless expressly defined in this application.

As shown in FIG. 1, a blade dicing device for wafers according to the present disclosure consists of a rotary shaft 10, a body 20, and a cutting blade 30.

The rotary shaft 10 rotates by a motor, and the body 20 and the cutting blade 30 are fitted to the rotary shaft 10 to be combined.

The body 20 is mounted on the rotary shaft 10 and rotates together with the rotary shaft 10, and is composed of a pair of symmetrical structures.

The cutting blade 30 is placed between the pair of bodies 20.

The cutting blade 30 is mounted on the rotary shaft 10 and rotates together with the rotary shaft 10, and is pressed and fixed between the pair of bodies 20.

The diameter of the cutting blade 30 is larger than the diameter of the body 20, so that the cutting blade 30 protrudes from the outer periphery of the body 20.

The cutting blade 30 cuts a wafer W while rotating.

Figure 2:
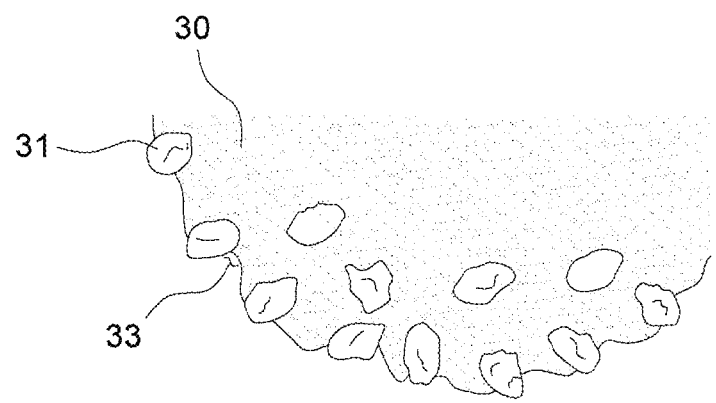
FIG. 2 is a view showing the grit and pocket of the cutting blade.

Referring to FIG. 2, grit 31 made of diamond material is bonded and attached to opposite end sides and the outer periphery of the cutting blade 30. In addition, a pocket 33, which is an empty space, is formed between the grit 31 particles to reduce frictional heat caused by dicing of the wafer W.

As previously described, because the wafer W of a compound semiconductor device made of SiC and GaN has high strength, when dicing with a standard cutting blade 30, that is, a conventional cutting blade, the cutting blade 30 breaks or a defect occurs in the diced wafer W.

In order to prevent damage to the cutting blade 30 or poor cutting of the wafer W, the present disclosure is improved as follows.

First, the grit 31 made of diamond material that is larger than the conventional one is used. In the present disclosure, the grit 31 having a length of 2 μm to 4 μm, which is about twice as large as the conventional grit 31, is used. The grit 31 that is larger is more strongly bonded and attached to the cutting blade 30, preventing the grit 31 from being separated from the cutting blade 30 during the dicing process, and the duration for wear due to dicing is longer, extending the lifespan.

Figure 3:
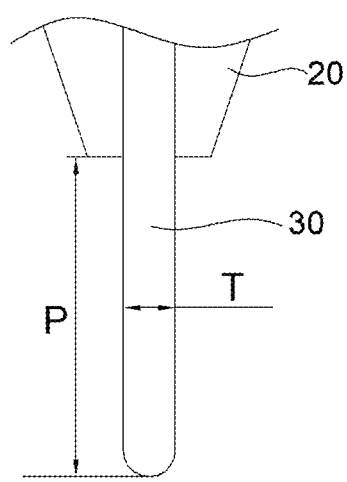
FIG. 3 is a view showing the cutting blade as the main part in FIG. 1.

Next, referring to FIG. 3, the thickness T of the cutting blade 30 protruding from the outer periphery of the body 20 is set to 35 μm to 40 μm, which is about 15% greater than that of the conventional case, and the length D protruding from the outer periphery of the body 20 is set to 650 μm to 750 μm, which is about 15% lesser than that of the conventional case, thereby minimizing micro-shaking (vibration) of the cutting blade 30 during the dicing process and preventing dicing defects of the wafer W.

Next, the rotation speed of the cutting blade 30 is set to 35,000 RPM to 45,000 RPM, which is about 10,000 RPM higher than that of the conventional case. The higher the RPM, the narrower the area of the grit 31 that comes into contact with the target (wafer W) during dicing, which reduces the impact and thus minimizes damage to the wafer W.

Next, the speed at which the wafer W is fed to the cutting blade 30 is set to 1.3 mm/s to 3.0 mm/s, which is about 2.5% of the conventional case. When the feed and transfer speeds of the wafer W are high, the dicing speed may become faster, but the consumption of the grit 31 accelerates. In addition, when the feed and transfer speeds of the wafer W are low, the processing load applied to the wafer W is reduced, thereby preventing damage to the wafer W.

Next, the wafer W is not cut at once, but is cut in two stages to mitigate physical impact during the dicing process. That is, the wafer W is cut in two stages by cutting about half of the thickness of the wafer W with a thick cutting blade 30, and then cutting the remainder of the thickness of the wafer W with a thin cutting blade 30. For example, in the first stage, cutting is performed with the blade 30 having a thickness of 35 μm to 40 μm, and in the second stage, cutting is performed with the blade 30 having a thickness of 25 μm to 30 μm.

Next, by applying a non-contact setup (NCS) method that allows height correction of the cutting blade 30 during dicing, the height of the cutting blade 30 is corrected by calculating the wear of the cutting blade 30 and using optical sensing, so that the cutting blade 30 cuts to the bottom of the wafer W without contacting the table on which the wafer W is placed.

Figure 4:
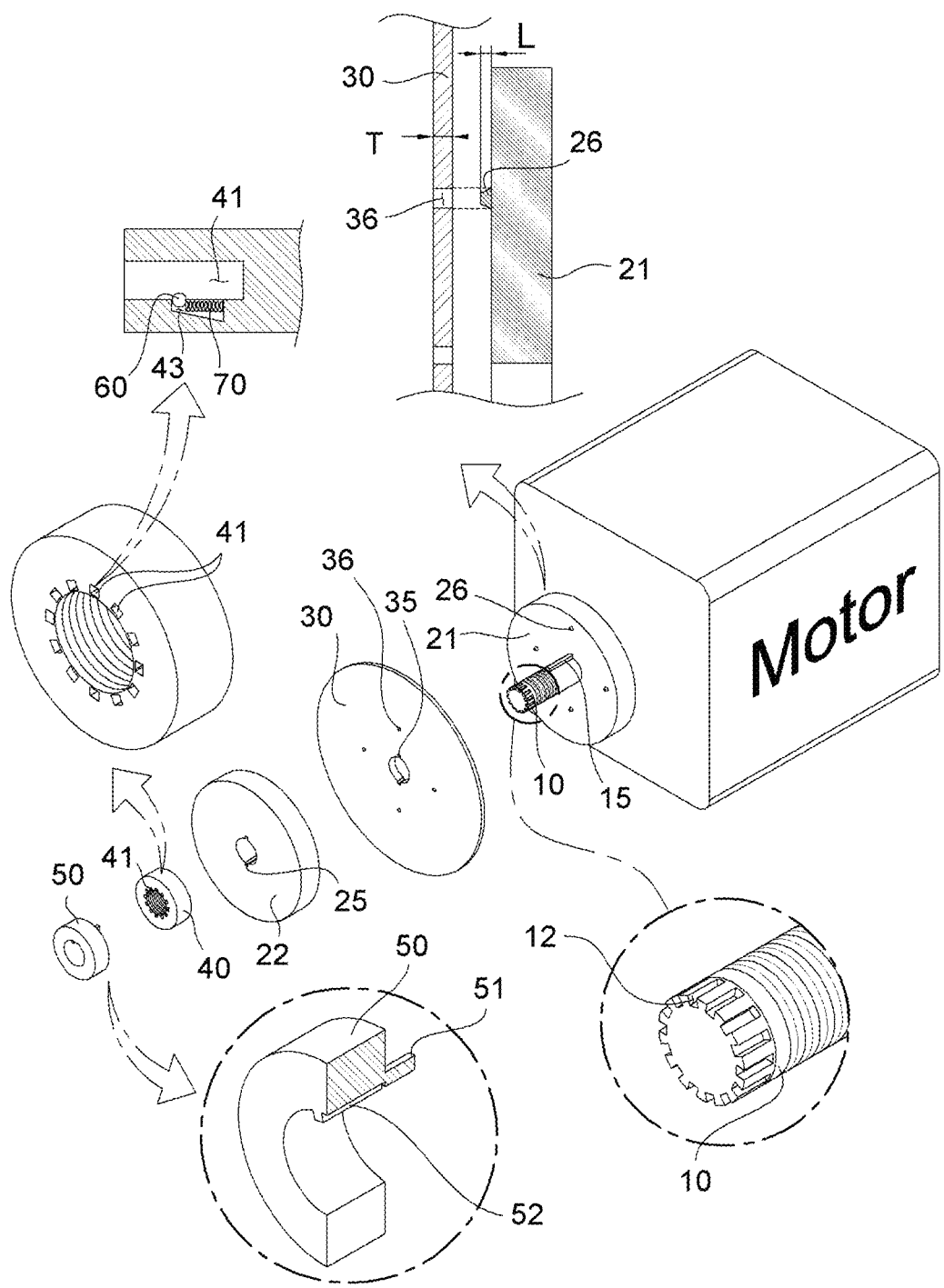
FIG. 4 is a view showing a structure that prevents micro-shaking of the cutting blade.

Referring to FIG. 4, for the body 20 and the cutting blade 30 to rotate together with the rotary shaft 10, a key protrusion 15 is formed on the rotary shaft 10, and key grooves 25 and 35 into which the key protrusion 15 is inserted are formed on the body 20 and the cutting blade 30, respectively. In addition, in the pair of bodies 20, a first body 21 is integrally connected to the rotary shaft 10 or fixedly connected to the rotary shaft 10, and a second body 22 is tightened to a tightening member 40 that is screw-connected to the rotary shaft 10, thereby applying pressure to and fixing the cutting blade 30 interposed between the pair of bodies 20.

There is a tolerance between the key protrusion 15 of the rotary shaft 10 and the key groove 35 of the cutting blade 30, and due to this tolerance, the cutting blade 30 may slightly shake. When the cutting blade 30 slightly shakes while rotating, a dicing defect of the wafer W may occur.

To prevent micro-shaking of the cutting blade 30, a plurality of fixing holes 36 are formed in the cutting blade 30, and fixing protrusions 26 that are inserted into the fixing holes 36 are formed in the first body 21. At this time, the protrusion length L of the fixing protrusion 26 is smaller than the thickness T of the cutting blade 30, and the fixing protrusion 26 has a structure in which the outer diameter gradually increases as going inward from the end, and the outer diameter of the inner end is equal to or larger than the inner diameter of the fixing hole 36. As a result, when the second body 22 pushes the cutting blade 30 toward the first body 21, the fixing protrusions 26 are fitted tightly into the fixing holes 36, thereby preventing the micro-shaking of the cutting blade 30.

The tightening member 40 may be slowly released from the screw-connected rotary shaft 10. To prevent the screw connection of the tightening member 40 from being released, first fixing grooves 41 are formed on the outer surface of the tightening member 40 at a portion corresponding to the periphery of the rotary shaft 10, and second fixing grooves 12 are formed in the longitudinal direction on the rotary shaft 10. In addition, a fixing member 50 fitted to the rotary shaft 10 is provided with a first protrusion 51 that is inserted into the first fixing groove 41 and a second protrusion 52 that is inserted into the second fixing groove 12. The first protrusion 51 and the second protrusion 52 prevent the tightening member 40 from rotating, thereby preventing loosening of the tightening member 40.

In this case, a pressure ball 60 is provided on the inner wall of the first fixing groove 41 so as to be able to move forward and backward, and the pressure ball 60 is supported by a spring 70 and receives force to move backward. A receiving groove 43 of the tightening member 40 in which the pressure ball 60 is received has a structure that deepens as going forward. Accordingly, when the first protrusion 51 is inserted into the first fixing groove 41, the pressure ball 60 is pushed backward by the first protrusion 51, thereby allowing the first protrusion 51 to be inserted into the first fixing groove 41. In normal times, the pressure ball 60 is pressed against the first protrusion 51, and when the first protrusion 51 is instantaneously subjected to a force to move backward, the pressure ball is pushed by the first protrusion 51 and tends to move backward together. However, when the pressure ball moves backward, the depth of the receiving groove 43 becomes shallower, so that the first protrusion 51 protrudes further from the receiving groove 43 and is strongly pressed, preventing the first protrusion 51 from being separated from the first fixing groove 41. For reference, if the first protrusion 51 does not move backward promptly but smoothly, the pressure ball 60 rotates so that the first protrusion 51 may move backward and be removed from the first fixing groove 41.

In explaining the present disclosure above, a blade dicing device for wafers having a specific shape and structure has been described with reference to the attached drawings, but the present disclosure may be variously modified and changed by those skilled in the art, and such modifications and changes should be interpreted as falling within the scope of protection of the present disclosure.

What is claimed is:

1. A blade dicing device for wafers, the device comprising:
    a body (20);
    a cutting blade (30) protruding from an outer periphery of the body (20); and
    grit (31) bonded and attached to an outer periphery of the cutting blade (30) and configured to cut a wafer,
    wherein a length of the grit (31) is 2 μm to 4 μm,
    a key protrusion (15) is provided on a rotary shaft (10) for the body (20) and the cutting blade (30) to rotate together with the rotary shaft (10), and key grooves (25 and 35) into which the key protrusion (15) is inserted are formed on the body (20) and the cutting blade (30), respectively,
    the body (20) includes a pair of bodies comprising a first body (21) and a second body (22), the first body (21) is integrally connected to the rotary shaft (10) or fixedly connected to the rotary shaft (10), and the second body (22) is tightened to a tightening member (40) that is screw-connected to the rotary shaft (10), thereby applying pressure to and fixing the cutting blade (30) interposed between the pair of bodies (20),
    a plurality of fixing holes (36) are formed in the cutting blade (30), while fixing protrusions (26) that are inserted into the fixing holes (36) are provided in the first body (21), wherein a protrusion length (L) of each of the fixing protrusions (26) is smaller than a thickness (T) of the cutting blade (30), and the each of the fixing protrusions (26) has a structure in which an outer diameter thereof gradually increases as going inward from an end, and an outer diameter of an inner end of the each of the fixing protrusions (26) is equal to or larger than an inner diameter of each of the fixing holes (36), so that when the second body (22) pushes the cutting blade (30) toward the first body (21), the fixing protrusions (26) are fitted into the fixing holes (36) in order to prevent micro-shaking of the cutting blade (30),
    first fixing grooves (41) are formed on an outer surface of a tightening member (40) at a portion corresponding to a periphery of the rotary shaft (10), while second fixing grooves (12) are formed in a longitudinal direction on the rotary shaft (10), and a fixing member (50) fitted to the rotary shaft (10) is provided with a first protrusion (51) that is inserted into one of the first fixing grooves (41) and a second protrusion (52) that is inserted into one of the second fixing grooves (12) to prevent the tightening member (40) from rotating, thereby preventing loosening of the tightening member (40), and
    a pressure ball (60) is provided on an inner wall of each of the first fixing grooves (41) so as to be able to move forward and backward, wherein the pressure ball (60) is supported by a spring (70) and receives force to move backward, and a receiving groove (43) of the tightening member (40) in which the pressure ball (60) is received has a structure that deepens as going forward, so that when the first protrusion (51) is inserted into the one of the first fixing grooves (41), the pressure ball (60) is pushed backward by the first protrusion (51), thereby allowing the first protrusion (51) to be inserted into the one of the first fixing grooves (41).

2. The device of claim 1, wherein the thickness of the cutting blade (30) is 35 μm to 40 μm, and a length of the cutting blade (30) protruding from the outer periphery of the body (20) is 650 μm to 750μ m.

3. The device of claim 1, wherein a rotation speed of the cutting blade (30) is 35,000 RPM to 45,000 RPM.

4. The device of claim 3, wherein a speed at which a wafer is fed to the cutting blade (30) is 1.3 mm/s to 3.0 mm/s.

* * * * *